(12) United States Patent
Chung et al.

(10) Patent No.: US 10,937,371 B2
(45) Date of Patent: Mar. 2, 2021

(54) SCAN DRIVER FOR SEQUENTIALLY DRIVING AND SIMULTANEOUSLY DRIVING A PLURALITY OF SCAN LINES AND DISPLAY DEVICE HAVING THE SAME

(71) Applicant: Samsung Display Co., Ltd., Yongin-si (KR)

(72) Inventors: Bo Yong Chung, Suwon-si (KR); Dongwoo Kim, Suwon-si (KR); Yeonkyung Kim, Seoul (KR); Chong Chul Chai, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 1 day.

(21) Appl. No.: 16/414,663

(22) Filed: May 16, 2019

(65) Prior Publication Data

US 2019/0378462 A1 Dec. 12, 2019

(30) Foreign Application Priority Data

Jun. 7, 2018 (KR) ........................ 10-2018-0065551

(51) Int. Cl.
*G09G 3/3266* (2016.01)
(52) U.S. Cl.
CPC ... *G09G 3/3266* (2013.01); *G09G 2310/0278* (2013.01); *G09G 2310/0286* (2013.01); *G09G 2310/08* (2013.01)

(58) Field of Classification Search
CPC ......... G09G 3/3266; G09G 2310/0286; G09G 2310/08; G09G 2310/0278; G11C 19/28
See application file for complete search history.

(56) References Cited

U.S. PATENT DOCUMENTS

2015/0206490 A1* 7/2015 Lim ..................... G09G 3/3677
345/92
2017/0365204 A1* 12/2017 Choi ...................... G11C 19/28

FOREIGN PATENT DOCUMENTS

KR    10-2006-0135385 A    12/2006

* cited by examiner

*Primary Examiner* — Kwang-Su Yang
(74) *Attorney, Agent, or Firm* — Lewis Roca Rothgerber Christie LLP

(57) ABSTRACT

A scan driver includes circuit stages each including a first input part to transfer a signal of a first node to a first output part having a second node in response to a first clock signal, a second input part to transfer a carry signal to the first node in response to a second clock signal that is different from the first clock signal, a holding part to maintain a signal of the second node, the first output part to transfer a third clock signal that is different from the first and second clock signals to an output terminal in response to the signal of the second node, a second output part to transfer the first clock signal to the output terminal in response to a signal of a third node, and a simultaneous driving part to turn off the second output part in response to the third clock signal.

20 Claims, 8 Drawing Sheets

SCAN DRIVER FOR SEQUENTIALLY DRIVING AND SIMULTANEOUSLY DRIVING A PLURALITY OF SCAN LINES AND DISPLAY DEVICE HAVING THE SAME

CROSS-REFERENCE TO RELATED APPLICATION

This application claims priority to, and the benefit of, Korean Patent Application No. 10-2018-0065551 filed on Jun. 7, 2018, which is hereby incorporated by reference for all purposes as if fully set forth herein.

BACKGROUND

1. Field

Embodiments of the present disclosure relate to a scan driver for sequentially driving and simultaneously driving a plurality of scan lines, and a display device having the scan driver.

2. Description of the Related Art

Recently, an organic light emitting display device is widely used as a display device.

The organic light emitting display device includes a plurality of pixels. Each of the plurality of pixels includes an organic light emitting diode, and a pixel circuit for driving the organic light emitting diode. The pixel circuit includes a plurality of transistors and a plurality of capacitors.

The organic light emitting display device includes a scan driver that outputs a plurality scan signals to a plurality of scan lines for driving a plurality of pixel circuits. The scan driver sequentially outputs the plurality scan signals to the plurality of scan lines.

SUMMARY

Embodiments of the present disclosure provide a scan driver for both sequentially driving and simultaneously driving a plurality of scan lines.

Embodiments of the present disclosure also provide a display device having the scan driver.

According to an embodiment of the present disclosure, there is provided a scan driver including a plurality of circuit stages cascade-connected with each other for outputting a plurality of scan signals, each circuit stage including a first input part configured to transfer a signal of a first node to a first output part having a second node in response to a first clock signal, a second input part configured to transfer a carry signal to the first node in response to a second clock signal that is different from the first clock signal, a holding part configured to maintain a signal of the second node as a first driving voltage of a first level, the first output part configured to transfer a third clock signal that is different from the first and second clock signals to an output terminal in response to the signal of the second node, a second output part configured to transfer the first clock signal to the output terminal in response to a signal of a third node, and a simultaneous driving part configured to turn off the second output part in response to the third clock signal.

The simultaneous driving part may include a ninth transistor including a control electrode for receiving the third clock signal, a first electrode for receiving a second driving voltage, and a second electrode coupled to the third node.

The simultaneous driving part may include a ninth transistor including a control electrode for receiving the third clock signal, a first electrode for receiving a second driving voltage, and a second electrode coupled to the first node.

The holding part may include a seventh transistor including a control electrode for receiving the second clock signal, a first electrode for receiving the first driving voltage, and a second electrode coupled to the second node.

The holding part may include a seventh transistor including a control electrode and a first electrode for receiving the second clock signal, and a second electrode coupled to the second node.

The third clock signal may have a first level for a simultaneous driving period, and a second level for a sequential driving period, and the simultaneous driving part may provide the third node with a second driving voltage of a second level in response to the third clock signal having the first level to turn off the second output part during the simultaneous driving period.

The scan driver may include a first output controlling part configured to transfer the second clock signal to the second node in response to the signal of the first node, and a second output controlling part configured to transfer the signal of the first node to the third node in response to the first driving voltage.

The first input part may include a fourth transistor including a control electrode for receiving a first clock signal, a first electrode coupled to the first node, and a second electrode coupled to the first output part, and the second input part may include a third transistor including a control electrode for receiving the second clock signal, a first electrode for receiving a carry signal, and a second electrode coupled to the first node.

The first output part may include a first transistor, a first capacitor, and a fifth transistor, wherein the first transistor includes a control electrode coupled to the second node, a first electrode for receiving the third clock signal, and a second electrode coupled to the output terminal, wherein the first capacitor includes a first electrode for receiving the third clock signal, and a second electrode coupled to the second node, and wherein the fifth transistor includes a control electrode coupled to the second node, a first electrode for receiving the third clock signal, and a second electrode coupled to the second electrode of the fourth transistor.

The second output part may include a second transistor and a second capacitor, wherein the second transistor includes a first electrode coupled to the third node, a first electrode for receiving the first clock signal, and a second electrode coupled to the output terminal, and wherein the second capacitor includes a first electrode coupled to the output terminal, and a second electrode coupled to the third node.

According to an embodiment of the present disclosure, there is provided a display device including a display panel including a switching transistor coupled to a scan line and a data line, an emission control transistor indirectly coupled to the switching transistor, and an organic light emitting diode coupled to emission control transistor, a timing controller configured to generate a first clock signal, a second clock signal that is different from the first clock signal, and a third clock signal that is different from the first and second clock signals, a scan driver configured to generate a plurality of scan signals based on the first, second, and third clock signals, configured to simultaneously output the plurality of scan signals during a simultaneous driving period, and configured to sequentially output the plurality of scan signals during a sequential driving period, the scan driver including a plurality of circuit stages cascade-connected with each other, each circuit stage including a first input part configured to transfer a signal of a first node to first output part having a second node in response to a first clock signal, a second input part configured to transfer a carry signal to the first node in response to a second clock signal that is different from the first clock signal, a holding part configured to maintain a signal of the second node to a first driving voltage of a first level, the first output part configured to transfer a third clock signal that is different from the first and second clock signals to an output terminal in response to the signal of the second node, a second output part configured to transfer the first clock signal to the output terminal in response to a signal of a third node, and a simultaneous driving part configured to turn off the second output part in response to the third clock signal.

The simultaneous driving part may include a ninth transistor including a control electrode for receiving the third clock signal, a first electrode for receiving a second driving voltage, and a second electrode coupled to the third node.

The simultaneous driving part may include a ninth transistor including a control electrode for receiving a third clock signal, a first electrode for receiving a second driving voltage, and a second electrode coupled to the first node.

The holding part may include a seventh transistor including a control electrode for receiving the second clock signal, a first electrode for receiving the first driving voltage, and a second electrode coupled to the second node.

The holding part may include a seventh transistor including a control electrode and a first electrode for receiving the second clock signal, and a second electrode coupled to the second node.

The third clock signal may have a first level for a simultaneous driving period, and a second level for a sequential driving period, wherein the simultaneous driving part provides the third node with a second driving voltage of a second level in response to the third clock signal of the first level to turn off the second output part during the simultaneous driving period.

The circuit stage may further include a first output controlling part configured to transfer the second clock signal to the second node in response to the signal of the first node, and a second output controlling part configured to transfer the signal of the first node to the third node in response to the first driving voltage.

The first input part may include a fourth transistor including a control electrode for receiving the first clock signal, a first electrode coupled to the first node, and a second electrode coupled to the first output part, and the second input part may include a third transistor including a control electrode for receiving the second clock signal, a first electrode for receiving a carry signal, and a second electrode coupled to the first node.

The first output part may include a first transistor, a first capacitor, and a fifth transistor, wherein the first transistor includes a control electrode coupled to the second node, a first electrode for receiving the third clock signal, and a second electrode coupled to the output terminal, wherein the first capacitor includes a first electrode for receiving the third clock signal, and a second electrode coupled to the second node, and wherein the fifth transistor includes a control electrode coupled to the second node, a first electrode for receiving the third clock signal, and a second electrode coupled to the second electrode of the fourth transistor.

The second output part may include a second transistor and a second capacitor, wherein the second transistor includes a control electrode coupled to the third node, a first electrode for receiving the first clock signal, and a second electrode coupled to the output terminal, and wherein the second capacitor includes a first electrode coupled to the output terminal, and a second electrode coupled to the third node.

According to the present disclosure, the circuit stage of the scan driver includes the simultaneous driving part. Thus, the scan driver simultaneously outputs a plurality of scan signals to a plurality of scan lines during the simultaneous driving period, and sequentially outputs a plurality of scan signals to a plurality of scan lines during the sequential driving period.

BRIEF DESCRIPTION OF THE DRAWINGS

The above and other features of the present disclosure will become more apparent by describing, in detail, embodiments thereof with reference to the accompanying drawings, in which.

DETAILED DESCRIPTION

Figure 1:
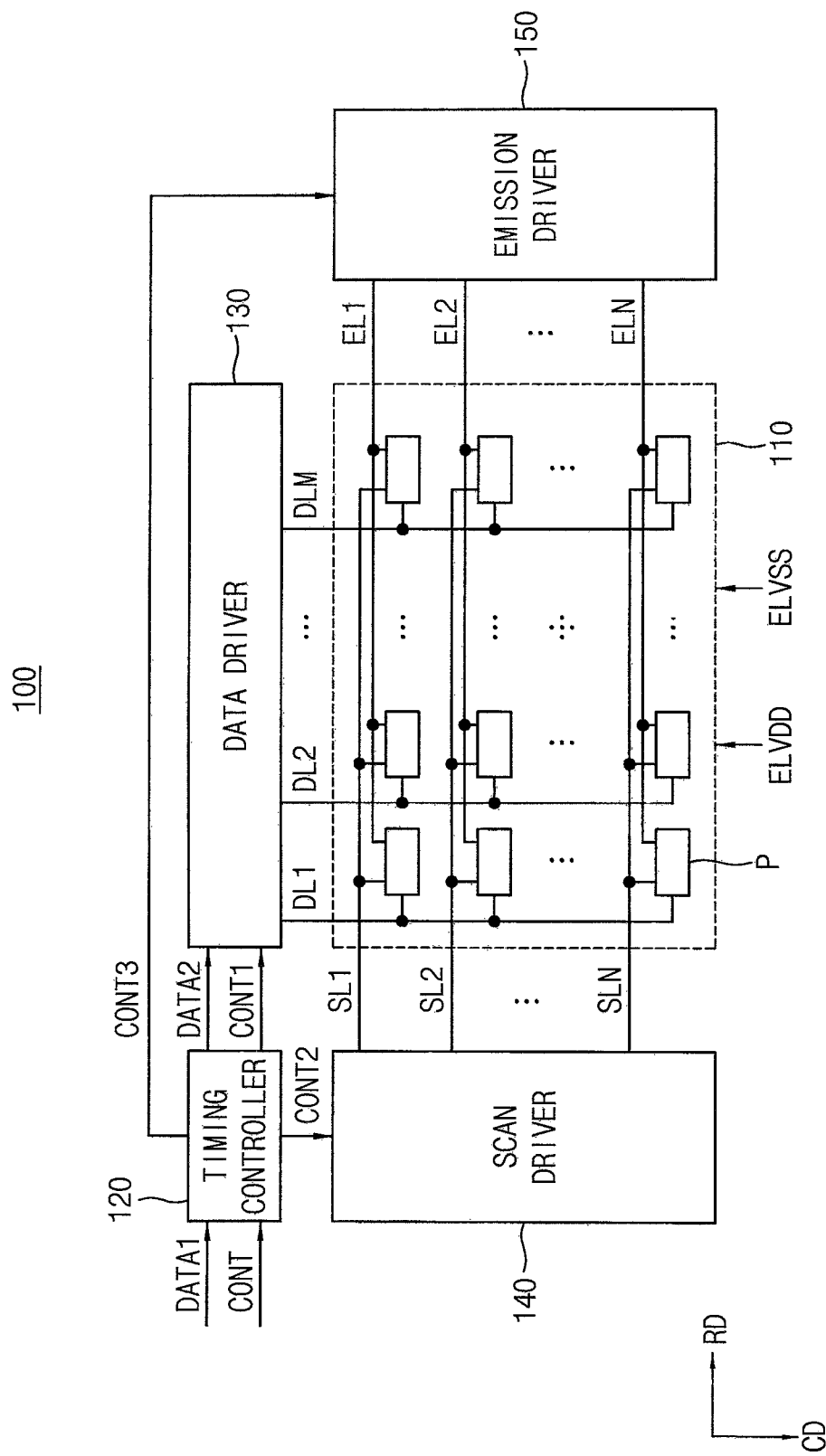
FIG. 1 is a block diagram illustrating a display device according to one embodiment.

Features of the inventive concept and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of the present inventive concept to those skilled in the art. Accordingly, processes, elements, and techniques that are not necessary to those having ordinary skill in the art for a complete understanding of the aspects and features of the present inventive concept may not be described. Unless otherwise noted, like reference numerals denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a block diagram illustrating a display device according to one embodiment.

Referring to FIG. 1, the display device may include a display panel 110, a timing controller 120, a data driver 130, a scan driver 140 and an emission driver 150.

The display panel 110 may include a plurality of pixels P, a plurality of scan lines SL1, . . . , SLN, a plurality of data lines DL1, . . . , DLM and a plurality of emission control lines EL1, . . . , ELN (wherein, 'N' and 'M' are natural numbers).

The pixels P may be arranged as a matrix type that includes a plurality of pixel rows and a plurality of pixel columns. Each pixel P is connected to a scan line, a data line and an emission control line, respectively.

The data lines DL1, . . . , DLM may extend in a column direction CD, and may be arranged in a row direction RD. The data lines DL1, . . . , DLM are connected to the data driver 130, and transfer data voltages to respective ones of the pixels P.

The scan lines SL1, . . . , SLN may extend in the row direction RD, and may be arranged in the column direction CD. The scan lines SL1, . . . , SLN are connected to the scan driver 140, and transfer scan signals respective ones of the pixels P.

The emission control lines EL1, . . . , ELN may extend in the row direction RD, and may be arranged in the column direction CD. The emission control lines EL1, . . . , ELN are connected to the emission driver 150, and transfer emission control signals to respective ones of the pixels P.

In addition, the pixels P may receive a first emission power voltage ELVDD and a second emission power voltage ELVSS. Each of the pixels P may receive a data voltage in response to the scan signal, and may emit a light corresponding to the data voltage using the first and second emission power voltages ELVDD and ELVSS.

The timing controller 120 may receive an image signal DATA1 and a control signal CONT from an external device. The image signal DATA1 may include red, green and blue data. The control signal CONT may include a horizontal synchronization signal Hsync, a vertical synchronization signal Vsync, a main clock signal MCLK, etc. The timing controller 120 may convert the image signal DATA1 to image data DATA2 corresponding to a pixel structure and a resolution of the display panel 110.

The timing controller 120 may generate a first control signal CONT1 for driving the data driver 130, a second control signal CONT2 for driving the scan driver 140, and a third control signal CONT3 for driving the emission driver 150, based on the control signal CONT.

The data driver 130 may convert the image data DATA2 to corresponding data voltages, and may output the respective data voltages to the data lines DL1, . . . , DLM in response to the first control signal CONT1.

The scan driver 140 may generate a plurality of scan signals in response to the second control signal CONT2 according to a driving mode of the display device.

The second control signal CONT2 may include a start pulse signal SP, a first clock signal CLK1, a second clock signal CLK2, and a third clock signal GCK.

The scan driver 140 may simultaneously output scan signals of a first level to the scan lines SL1, . . . , SLN based on the second control signal CONT2. Alternatively, the scan driver 140 may sequentially output scan signals of the first level to the scan lines SL1, . . . , SLN along the column direction CD, which is a scan direction, based on the second control signal CONT2.

According to the present embodiment, the scan driver 140 may simultaneously output scan signals of a first level to the scan lines SL1, . . . , SLN during a simultaneous driving period, and may sequentially output scan signals of the first level to the scan lines SL1, . . . , SLN during a sequential driving period.

The emission driver 150 may generate a plurality of emission control signals in response to the third control signal CONT3 according to a driving mode of the display device. The emission driver 150 may simultaneously output emission control signals of a first level to the emission control lines EL1, . . . , ELN based on the third control signal CONT3. Alternatively, the emission driver 150 may sequentially output emission control signals of the first level to the emission control lines EL1, . . . , ELN along the column direction CD/scan direction based on the third control signal CONT3. Alternatively, the emission driver 150 may simultaneously output emission control signals of the first level to the emission control lines EL1, . . . , ELN during a simultaneous driving period, and may sequentially output emission control signals of the first level to the emission control lines EL1, . . . , ELN during a sequential driving period.

Figure 2:
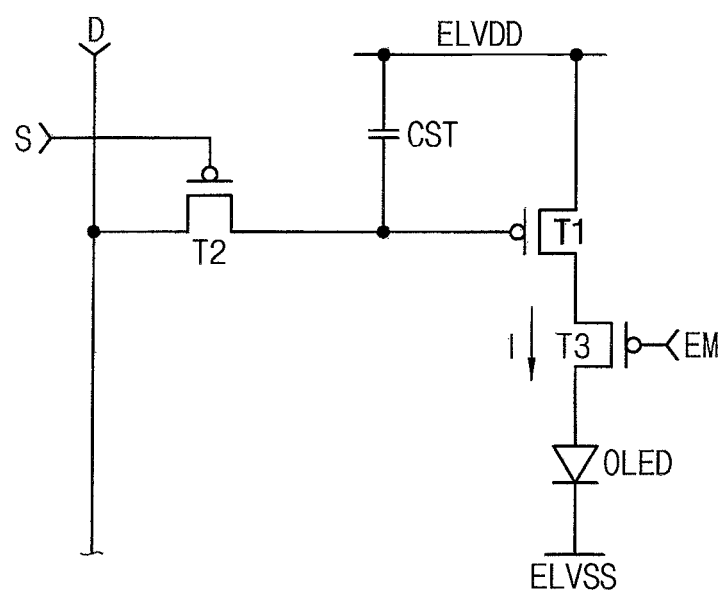
FIG. 2 is a circuit diagram illustrating a pixel of FIG. 1.

FIG. 2 is a circuit diagram illustrating a pixel of FIG. 1.

Referring to FIGS. 1 and 2, for example, the pixel P includes a pixel circuit. The pixel circuit may include an organic light emitting diode OLED, a driving transistor T1, a capacitor CST, a switching transistor T2, and an emission control transistor T3.

The driving transistor T1 includes a control electrode connected to the switching transistor T2, a first electrode receiving the first emission power voltage ELVDD, and a second electrode connected to the emission control transistor T3.

The capacitor CST includes a first electrode receiving the first emission power voltage ELVDD, and a second electrode connected to the control electrode of the driving transistor T1.

The switching transistor T2 include a control electrode for receiving a scan signal S, a first electrode for receiving a data voltage D, and a second electrode connected to the control electrode of the driving transistor T1.

The emission control transistor T3 includes a control electrode for receiving the emission control signal EM, a first electrode connected to the second electrode of the driving transistor T1, and a second electrode connected to the organic light emitting diode OLED.

The organic light emitting diode OLED includes a first electrode connected to the emission control transistor T3, and a second electrode for receiving the second emission power voltage ELVSS.

When the emission control transistor T3 is turned on, a current I is applied to the organic light emitting diode OLED through the driving transistor T1. Thus, the organic light emitting diode OLED may emit a light.

The pixel circuit is not limited thereto, and may be designed variously in other embodiments.

Figure 3:
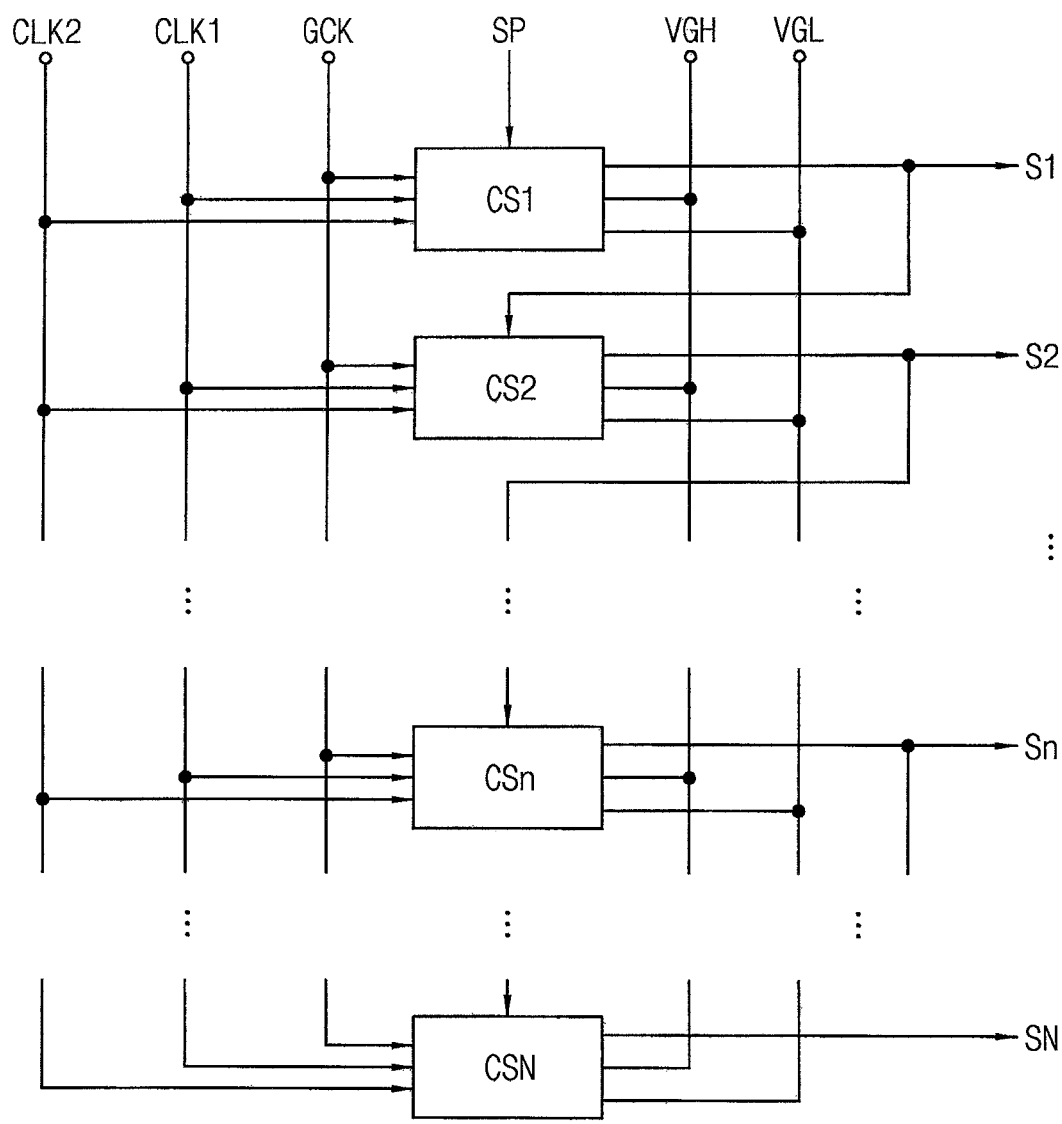
FIG. 3 is a block diagram illustrating a scan driver of FIG. 1.

FIG. 3 is a block diagram illustrating a scan driver of FIG. 1.

Referring to FIGS. 1 and 3, the scan driver 140 may include a plurality of circuit stages CS1, . . . , CSn, . . . , CSN that are cascade-connected with each other, and the plurality of circuit stages CS1, . . . , CSn, . . . , CSN may be configured to output a plurality of scan signals S1, S2, . . . , Sn, . . . , SN.

According to the present embodiment, the scan driver 140 may simultaneously output a plurality of scan signals S1, S2, . . . , Sn, . . . , SN, and may also sequentially output a plurality of scan signals S1, S2, . . . , Sn, . . . , SN (e.g., according to a driving mode).

The circuit stages CS1, . . . , CSn, . . . , CSN may receive a carry signal, a first driving voltage VGL, a second driving voltage VGH, a first clock signal CLK1, a second clock signal CLK2 and a third clock signal GCK.

The carry signal may be a start pulse signal SP provided from the timing controller 120, or may be a previous scan signal provided from a previous circuit stage.

For example, the first circuit stage CS1 receives a start pulse signal SP as a carry signal, and outputs a first scan signal S1 in response to the start pulse signal SP. A second circuit stage CS2 receives the first scan signal S1 of the first circuit stage CS1, which is the previous circuit stage, and outputs a second scan signal S2 in response to the first scan signal S1.

The first driving voltage VGL has a first level, and the second driving voltage VGH has a second level that is higher than the first level. For example, the first driving voltage VGL may have a low voltage L, and the second driving voltage VGH may have a high voltage H.

The first and second driving voltages VGL and VGH may be provided to the circuit stages CS1, . . . , CSn, . . . , CSN, commonly.

The first clock signal CLK1 has a second level being that is different from the first level. For example, the first level may be a low voltage L and the second level may be a high voltage H.

The first clock signal CLK1 may be a DC (direct current) signal having the high voltage during a simultaneous driving period, and may be an AC (alternating current) signal swinging between the high voltage and the low voltage during a sequential driving period. For example, the first clock signal CLK1 may control an output timing of an even numbered scan signal outputted from an even numbered circuit stage of the circuit stages CS1, . . . , CSn, . . . , CSN.

The second clock signal CLK2 may be a DC signal having the high voltage during a simultaneous driving period, and may be an AC signal swinging between the high voltage and the low voltage during a sequential driving period. The second clock signal CLK2 may be delayed by a single horizontal period (1H) from the first clock signal CLK1. For example, the second clock signal CLK2 may control an output timing of an odd numbered scan signal outputted from an odd numbered circuit stage of the circuit stages CS1, . . . , CSn, . . . , CSN.

The third clock signal GCK may be a DC signal having the low voltage during a simultaneous driving period, and may be a DC signal having the high voltage during a sequential driving period. The third clock signal GCK may be provided to the circuit stages CS1, . . . , CSn, . . . , CSN, commonly.

According to the present embodiment, the circuit stages CS1, . . . , CSn, . . . , CSN may simultaneously output the first to n-th scan signals S1, S2, . . . , Sn, . . . , SN having the low voltage during all of the simultaneous driving period. In addition, the circuit stages CS1, . . . , CSn, . . . , CSN may sequentially output the first to n-th scan signals S1, S2, . . . , Sn, . . . , SN having the low voltage in a corresponding horizontal period during the sequential driving period.

Figure 4:
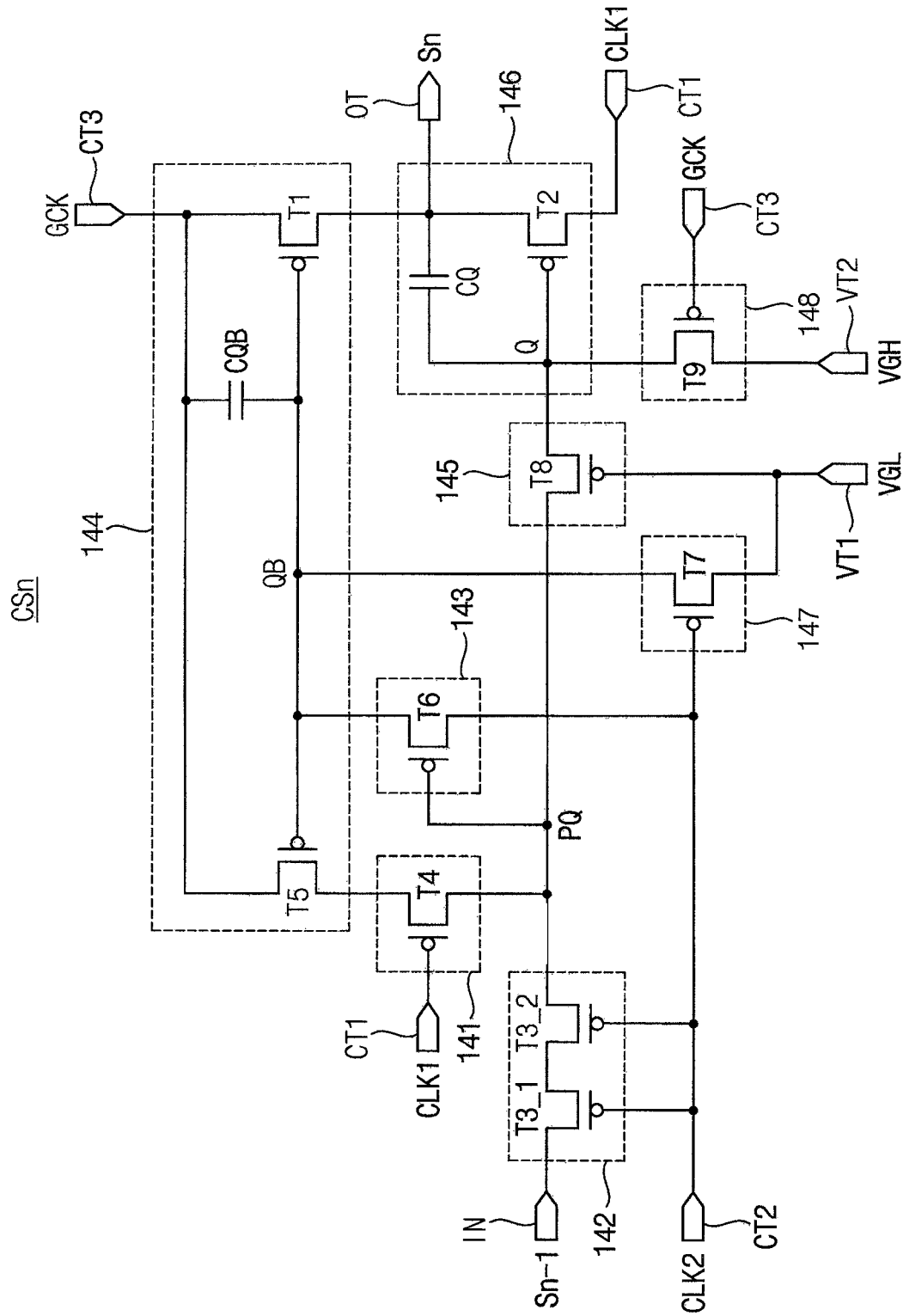
FIG. 4 is a circuit diagram illustrating a circuit stage of FIG. 3.

FIG. 4 is a circuit diagram illustrating a circuit stage of FIG. 3.

Referring to FIGS. 3 and 4, an n-th circuit stage CSn may include an input terminal IN, a first clock terminal CT1, a second clock terminal CT2, a third clock terminal CT3, a first driving voltage terminal VT1, a second driving voltage terminal VT2, and an output terminal OT.

The input terminal IN receives a carry signal. The carry signal may be a start pulse signal SP or a previous scan signal outputted from a previous circuit stage.

The first clock terminal CT1 receives a first clock signal CLK1.

The second clock terminal CT2 receives a second clock signal CLK2 delayed from the first clock signal CLK1. For example, the second clock signal CLK2 may be delayed from the first clock signal CLK1 by one horizontal period (1H).

The third clock terminal CT3 receives the third clock signal GCK. The third clock signal GCK has a low voltage during a simultaneous driving period, and a high voltage during the sequential driving period. The simultaneous driving period and the sequential driving period may be designed variously according to a method of driving the display device.

The first driving voltage terminal VT1 receives a first driving voltage VGL. The first driving voltage VGL may have a low voltage L.

The second driving voltage terminal VT2 receives a second driving voltage VGH. The second driving voltage VGH may have a high voltage H.

The output terminal OT outputs an n-th scan signal Sn as an output signal.

For example, referring to the first circuit stage CS1, the input terminal IN receives a start pulse signal SP outputted from the timing controller 120 as the carry signal. The first clock terminal CT1 receives a first clock signal CLK1, a second clock terminal CT2 receives a second clock signal CLK2, and a third clock terminal CT3 receives a third clock signal GCK. The first driving voltage terminal VT1 receives a first driving voltage VGL, the second driving voltage terminal VT2 receives a second driving voltage VGH, and the output terminal OT outputs a first scan signal S1 based on the first clock signal CLK1.

Referring to a second circuit stage CS2, the input terminal IN receives the first scan signal S1 outputted from the first circuit stage CS1 as the carry signal, the first clock terminal CT1 receives the second clock signal CLK2 in a manner that is opposite to the first circuit stage CS1, the second clock terminal CT2 receives the first clock signal CLK1 in a manner that is opposite to the first circuit stage CS1, the third clock terminal CT3 receives the third clock signal GCK, the first driving voltage terminal VT1 receives the first driving voltage VGL, the second driving voltage terminal VT2 receives the second driving voltage VGH, and the output terminal OT outputs a second scan signal S2 based on the second clock signal CLK2.

Hereinafter, the n-th circuit stage CSn is explained.

Transistors in the circuit stage may each be a PMOS (P-channel Metal Oxide Semiconductor) transistor that turns on in response to a low voltage, but are not limited thereto. The transistors may instead be an NMOS (N-channel Metal Oxide Semiconductor) transistor that turns on in response to a high voltage.

Referring to the n-th circuit stage CSn, the input terminal IN receives an (n-1)-th scan signal Sn-1 as the carry signal, the first clock terminal CT1 receives a first clock signal CLK1, a second clock terminal CT2 receives a second clock signal CLK2, a third clock terminal CT3 receives a third clock signal GCK, and the output terminal OT outputs an n-th scan signal Sn.

The n-th circuit stage CSn may include a first input part 141, a second input part 142, a first output controlling part 143, a first output part 144, a second output controlling part 145, a second output part 146, a holding part 147, and a simultaneous driving part 148.

The first input part 141 may transfer a signal of a first node (PQ node) PQ to the first output part 144 having a second node (QB node) QB in response to a first clock signal CLK1 received from first clock terminal CT1. The first input part 141 includes a fourth transistor T4. The fourth transistor T4 includes a control electrode connected to a first clock terminal CT1, a first electrode connected to the PQ node PQ and a second electrode connected to the first output part 144.

The second input part 142 transfers an (n-1)-th scan signal Sn-1 received from the input terminal IN to the PQ node PQ in response to the second clock signal CLK2 received from the second clock terminal CT2. The second input part 142 includes a third transistor(s) T3-1 and T3-2. The third transistor T3-1 and T3-2 includes a control electrode connected to the second clock terminal CT2, a first electrode connected to the input terminal IN, and a second electrode connected to the PQ node PQ.

The first output controlling part 143 transfers the second clock signal CLK2 received from the second clock terminal CT2 to the QB node QB in response to a signal of the PQ node PQ. The first output controlling part 143 includes a sixth transistor T6. The sixth transistor T6 includes a control electrode connected to the PQ node PQ, a first electrode connected to the second clock terminal CT2, and a second electrode connected to the QB node QB.

The first output part 144 transfers the third clock signal GCK received from the third clock terminal CT3 to the output terminal OT in response to a signal of the QB node QB. The first output part 144 includes a first transistor T1, a first capacitor CQB and a fifth transistor T5.

The first transistor T1 includes a control electrode connected to the QB node QB, a first electrode connected to the third clock terminal CT3, and a second electrode connected to the output terminal OT. The first capacitor CQB includes a first electrode connected to the third clock terminal CT3 and a second electrode connected to the QB node QB. The fifth transistor T5 includes a control electrode connected to the QB node QB, a first electrode connected to the third clock terminal CT3, and a second electrode connected to the second electrode of the fourth transistor T4.

The second output controlling part 145 transfers a signal of the PQ node PQ to a third node (Q node) Q in response to the first driving voltage VGL received from the first driving voltage terminal VT1. The second output controlling part 145 includes an eighth transistor T8. The eighth transistor T8 includes a control electrode connected to the first driving voltage terminal VT1, a first electrode connected to the PQ node PQ, and a second electrode connected to the Q node Q.

The second output part 146 transfers the first clock signal CLK1 received from the first clock terminal CT1 to the output terminal OT in response to a signal of the Q node Q. The second output part 146 includes a second transistor T2 and a second capacitor CQ. The second transistor T2 includes a control electrode connected to the Q node Q, a first electrode connected to the first clock terminal CT1, and a second electrode connected to the output terminal OT. The second capacitor CQ includes a first electrode connected to the output terminal OT, and a second electrode connected to the Q node Q.

The holding part 147 applies the first driving voltage VGL received from the first driving voltage terminal VT1 to the QB node QB in response to the second clock signal CLK2 received from the second clock terminal CT2. The holding part 147 includes a seventh transistor T7. The seventh transistor T7 includes a control electrode connected to the second clock terminal CT2, a first electrode connected to the first driving voltage terminal VT1, and a second electrode connected to the QB node QB.

The simultaneous driving part 148 transfers the second driving voltage VGH received from the second driving voltage terminal VT2 to the Q node Q in response to the third clock signal GCK. The simultaneous driving part 148 includes a ninth transistor T9. The ninth transistor T9 includes a control electrode connected to the third clock terminal CT3, a first electrode connected to the second driving voltage terminal VT2, and a second electrode connected to the Q node Q.

Figure 5:
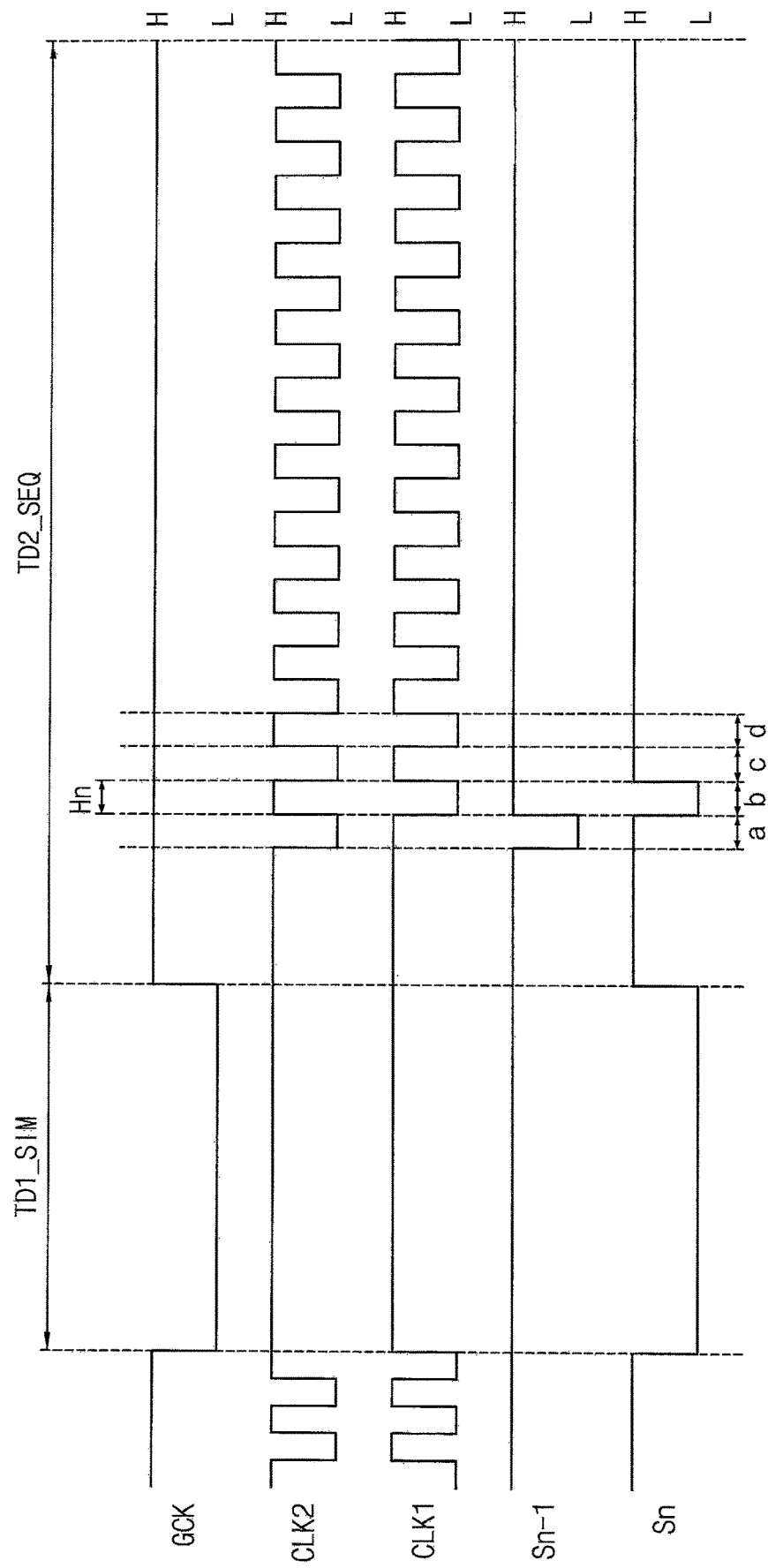
FIG. 5 is a waveform diagram illustrating a method of driving the circuit stage of FIG. 4.

FIG. 5 is a waveform diagram illustrating a method of driving the circuit stage of FIG. 4.

Referring to FIGS. 4 and 5, the n-th circuit stage CSn may be driven according to a simultaneous driving period TD1_SIM and a sequential driving period TD2_SEQ based on a control of the timing controller.

In the simultaneous driving period TD1_SIM, the first clock signal CLK1 has the high voltage H, a second clock signal CLK2 has the high voltage H, the third clock signal GCK has the low voltage L, and the (n-1)-th scan signal Sn-1 that is the carry signal has the high voltage H.

The ninth transistor T9 is turned on in response to the low voltage L of the third clock signal GCK. When the ninth transistor T9 is turned on, the high voltage H of the second driving voltage VGH is applied to the Q node Q.

When the high voltage H is applied to the Q node Q, the second transistor T2 is turned off in response to the high voltage H of the Q node Q.

The eighth transistor T8 is turned on in response to the low voltage L of the first driving voltage VGL. When the eighth transistor T8 is turned on, the high voltage H of the Q node Q is applied to the PQ node PQ. Thus, the sixth transistor T6, which is connected to the Q node Q (e.g., via the eighth transistor T8 being turned on), is turned off in response to the high voltage H of the PQ node PQ.

However, a voltage applied to the first electrode of the first capacitor CQB, which is connected to the third clock terminal CT3, is changed from the high voltage H to the low voltage L, and the first capacitor CQB is bootstrapped. Thus, a voltage applied to the second electrode of the first capacitor CQB, which is connected to the QB node QB, is changed from the low voltage L to a bootstrapped voltage 2L, which is lower than the low voltage L.

The first transistor T1 is turned on in response to the bootstrapped voltage 2L, and thus, the low voltage L of the third clock signal GCK is transferred to the output terminal OT.

Thus, during the simultaneous driving period, the output terminal OT outputs the low voltage L of the third clock signal GCK as the scan signal Sn.

In the sequential driving period TD2_SEQ, the third clock signal GCK has the high voltage H, which is different from the low voltage L in the simultaneous driving period TD1_SIM. The first and second clock signals CLK1 and CLK2 have an AC signal that swings between the high voltage H and the low voltage L, and have a repetitive cycle as a 2-horizontal period (2H). For example, the second clock signal CLK2 may have a phase that is opposite to that of the first clock signal CLK1. The first clock signal CLK1 may be delayed by one half (½) of the 2-horizontal-period repetitive cycle (2H) (i.e., one horizontal period 1H) from the second clock signal CLK2.

The (n-1)-th scan signal Sn-1 that is a carry signal has the low voltage L for an (n-1)-th horizontal period Hn-1 (e.g., a horizontal period immediately preceding an nth horizontal period Hn shown in FIG. 5), and has the high voltage H for remaining horizontal periods of the sequential driving period TD2_SEQ.

A sequential driving period TD2_SEQ of the n-th circuit stage CSn may include a first period 'a,' a second period 'b,' a third period 'c,' and a fourth period 'd'.

Referring to the first period 'a,' the first clock signal CLK1 has the high voltage H, the second clock signal CLK2 has the low voltage L, the third clock signal GCK has the high voltage H, and the (n-1)-th scan signal Sn-1 has the low voltage L.

The simultaneous driving part 148 includes the ninth transistor T9. The ninth transistor T9 is turned off in response to the high voltage H of the third clock signal GCK. Thus, during the sequential driving period TD2_SEQ, the simultaneous driving part 148 is not driven due to the high voltage H of the third clock signal GCK.

The first input part 141 includes the fourth transistor T4. The fourth transistor T4 is turned off in response to the high voltage H of the first clock signal CLK1.

The second input part 142 includes the third transistor(s) T3-1 and T3-2. The third transistor T3-1 and T3-2 is turned on in response to the low voltage L of the second clock signal CLK2, and thus, the low voltage L of the (n-1)-th scan signal Sn-1 is transferred to the PQ node PQ.

The first output controlling part 143 includes the sixth transistor T6. The sixth transistor T6 is turned on in response to the low voltage L of the PQ node PQ, and thus low voltage L of the second clock signal CLK2 is transferred to the QB node QB.

The holding part 147 includes the seventh transistor T7. The seventh transistor T7 is turned on in response to the low voltage L of the second clock signal CLK2, and thus the low voltage L of the first driving voltage VGL is transferred to the QB node QB. The QB node QB is maintained at the low voltage L.

The first output part 144 transfers the high voltage H of the third clock signal GCK received from the third clock terminal CT3 to the output terminal OT in response to the low voltage L of the QB node QB. The first output part 144 includes the fifth transistor T5 and the first transistor T1. The fifth transistor T5 and the first transistor T1 are turned on in response to the low voltage L of the QB node QB. The first electrode of the first capacitor CQB receives the high voltage H of the third clock signal GCK, and the second electrode of the first capacitor CQB receives the low voltage L of the QB node QB.

The second output controlling part 145 includes an eighth transistor T8. The eighth transistor T8 is turned on in response to the first driving voltage VGL received from the first driving voltage terminal VT1, and thus, the low voltage L of the PQ node PQ is transferred to the Q node Q.

The second output part 146 includes the second transistor T2. The second transistor T2 is turned on in response to the low voltage L of the Q node Q, and thus the high voltage H of the first clock signal CLK1 is outputted through the output terminal OT. The first electrode of the second capacitor CQ receives the high voltage H of the output terminal OT, and the second electrode of the second capacitor CQ receives the low voltage L of the Q node Q.

Therefore, during the first period 'a,' the output terminal OT of the n-th circuit stage CSn may output the high voltage H received from the first and second output parts 144 and 146.

Referring to the second period 'b,' the first clock signal CLK1 has the low voltage L, the second clock signal CLK2 has the high voltage H, the third clock signal GCK had the high voltage H, and the (n-1)-th scan signal Sn-1 has the high voltage H.

The simultaneous driving part 148 includes the ninth transistor T9. The ninth transistor T9 is turned off in response to the high voltage H of the third clock signal GCK.

The first input part 141 includes the fourth transistor T4. The fourth transistor T4 is turned on in response to the low voltage L of the first clock signal CLK1.

The second input part 142 includes the third transistor T3-1 and T3-2. The third transistor T3-1 and T3-2 is turned off in response to the high voltage H of the second clock signal CLK2. The PQ node PQ is maintained to the low voltage L that is a previous voltage.

The first output controlling part 143 includes the sixth transistor T6. The sixth transistor T6 is turned on in response to the low voltage L of the PQ node PQ, and thus the high voltage H of the second clock signal CLK2 is transferred to the QB node QB.

The holding part 147 includes the seventh transistor T7. The seventh transistor T7 is turned off in response to the high voltage H of the second clock signal CLK2.

The first output part 144 includes the fifth transistor T5 and the first transistor T1. The fifth transistor T5 and the first transistor T1 are turned off in response to the high voltage H of the QB node QB, and the first output part 144 does not transfer a signal to the output terminal OT.

The second output controlling part 145 includes the eighth transistor T8. The eighth transistor T8 is turned on in response to the low voltage L of the first driving voltage VGL received from the first driving voltage terminal VT1, and thus the low voltage L of the PQ node PQ is transferred to the Q node Q.

The second output part 146 includes the second transistor T2. The second transistor T2 is turned on in response to the low voltage L of the Q node Q, and thus the low voltage L of the first clock signal CLK1 is transferred to the output terminal OT. The first electrode of the second capacitor CQ, which is connected to the output terminal OT, receives the low voltage L of the first clock signal CLK1, and thus the second capacitor CQ is bootstrapped. Therefore, a voltage applied to the second electrode of the second capacitor CQ is changed from the low voltage L to the bootstrapped voltage 2L.

The Q node Q connected to the second electrode of the second capacitor CQ receives the bootstrapped voltage 2L, and the second transistor T2 is turned on in response to the bootstrapped voltage 2L. Thus, the low voltage L of the first clock signal CLK1 is transferred to the output terminal OT.

Therefore, during the second period 'b,' the n-th circuit stage CSn may output the low voltage L received from the second output part 146 through the output terminal OT.

Referring to the third period 'c,' the first clock signal CLK1 has the high voltage H, the second clock signal CLK2 has the low voltage L, the third clock signal GCK has the high voltage H, and the (n-1)-th scan signal Sn-1 has the high voltage H.

The simultaneous driving part 148 includes the ninth transistor T9. The ninth transistor T9 is turned off in response to the high voltage H of the third clock signal GCK.

The first input part 141 includes the fourth transistor T4. The fourth transistor T4 is turned off in response to the high voltage H of the first clock signal CLK1.

The second input part 142 includes the third transistor T3-1 and T3-2. The third transistor T3-1 and T3-2 are turned on in response to the low voltage L of the second clock signal CLK2, and the high voltage H of the (n-1)-th scan signal Sn-1 is transferred to the PQ node PQ.

The first output controlling part 143 includes the sixth transistor T6. The sixth transistor T6 is turned off in response to the high voltage H of the PQ node PQ.

The holding part 147 includes the seventh transistor T7. The seventh transistor T7 is turned on in response to the low voltage L of the second clock signal CLK2, and thus the first driving voltage VGL is applied to the QB node QB. The QB node QB is maintained at the first driving voltage VGL that is the low voltage L.

The first output part 144 transfers the high voltage H of the third clock signal GCK received from the third clock terminal CT3 to the output terminal OT in response to the low voltage L of the QB node QB. The first output part 144 includes the fifth transistor T5 and the first transistor T1. The fifth transistor T5 and the first transistor T1 are turned on in response to the low voltage L of the QB node QB. The first electrode of the first capacitor CQB receives the high voltage H of the third clock signal GCK, and the second electrode of the first capacitor CQB receives the low voltage L of the QB node QB.

The second output controlling part 145 includes the eighth transistor T8. The eighth transistor T8 is turned on in response to the low voltage L of the first driving voltage VGL received from the first driving voltage terminal VT1, and thus the high voltage H of the PQ node PQ is transferred to the Q node Q.

The second output part 146 includes the second transistor T2. The second transistor T2 is turned off in response to the high voltage H of the Q node Q.

Therefore, during the third period 'c,' the n-th circuit stage CSn may output the high voltage H received from the first output part 144 through the output terminal OT.

Referring to the fourth period 'd,' the first clock signal CLK1 has the low voltage L, the second clock signal CLK2 has the high voltage H, the third clock signal GCK has the high voltage H, and the (n-1)-th scan signal Sn-1 has the high voltage H.

The simultaneous driving part 148 includes the ninth transistor T9. The ninth transistor T9 is turned off in response to the high voltage H of the third clock signal GCK.

The first input part 141 includes the fourth transistor T4. The fourth transistor T4 is turned on in response to the low voltage L of the first clock signal CLK1.

The second input part 142 includes the third transistor T3-1 and T3-2. The third transistor T3-1 and T3-2 are turned off in response to the high voltage H of the second clock signal CLK2. The PQ node PQ is maintained to the high voltage H that is a previous voltage.

The first output controlling part 143 includes the sixth transistor T6. The sixth transistor T6 is turned off in response to the high voltage H of the PQ node PQ. The QB node QB is maintained to the low voltage L that is a previous voltage.

The holding part 147 includes the seventh transistor T7. The seventh transistor T7 is turned off in response to the high voltage H of the second clock signal CLK2. The QB node QB is maintained to the low voltage L that is a previous voltage.

The first output part 144 transfers the high voltage H of the third clock signal GCK received from the third clock terminal CT3 to the output terminal OT in response to the low voltage L of the QB node QB. The first output part 144 includes the fifth transistor T5 and the first transistor T1. The fifth transistor T5 and the first transistor T1 are turned on in response to the low voltage L of the QB node QB.

The second output controlling part 145 includes the eighth transistor T8. The eighth transistor T8 is are turned on in response to the low voltage L of the first driving voltage VGL received from the first driving voltage terminal VT1, and the high voltage H of the PQ node PQ is transferred to the Q node Q.

The second output part 146 includes the second transistor T2. The second transistor T2 is turned off in response to the high voltage H of the Q node Q.

Therefore, during the fourth period 'd,' the n-th circuit stage CSn may output the high voltage H received from the first output part 144 through the output terminal OT.

As described above, the n-th circuit stage outputs the low voltage L to the n-th scan line during all of the simultaneous driving period TD1_SIM. In addition, the n-th circuit stage outputs the low voltage L to the n-th scan line during the n-th horizontal period Hn of the sequential driving period TD2_SEQ, and outputs the high voltage H to the n-th scan line during remaining horizontal periods of the sequential driving period TD2_SEQ.

According to the embodiment, the scan driver simultaneously outputs a plurality of scan signals during the simultaneous driving period, and sequentially outputs a plurality of scan signals during the sequential driving period.

Hereinafter, the same reference numerals will be used to refer to the same or similar parts as those described in the previous embodiment, and any repetitive detailed explanation will be omitted.

Figure 6:
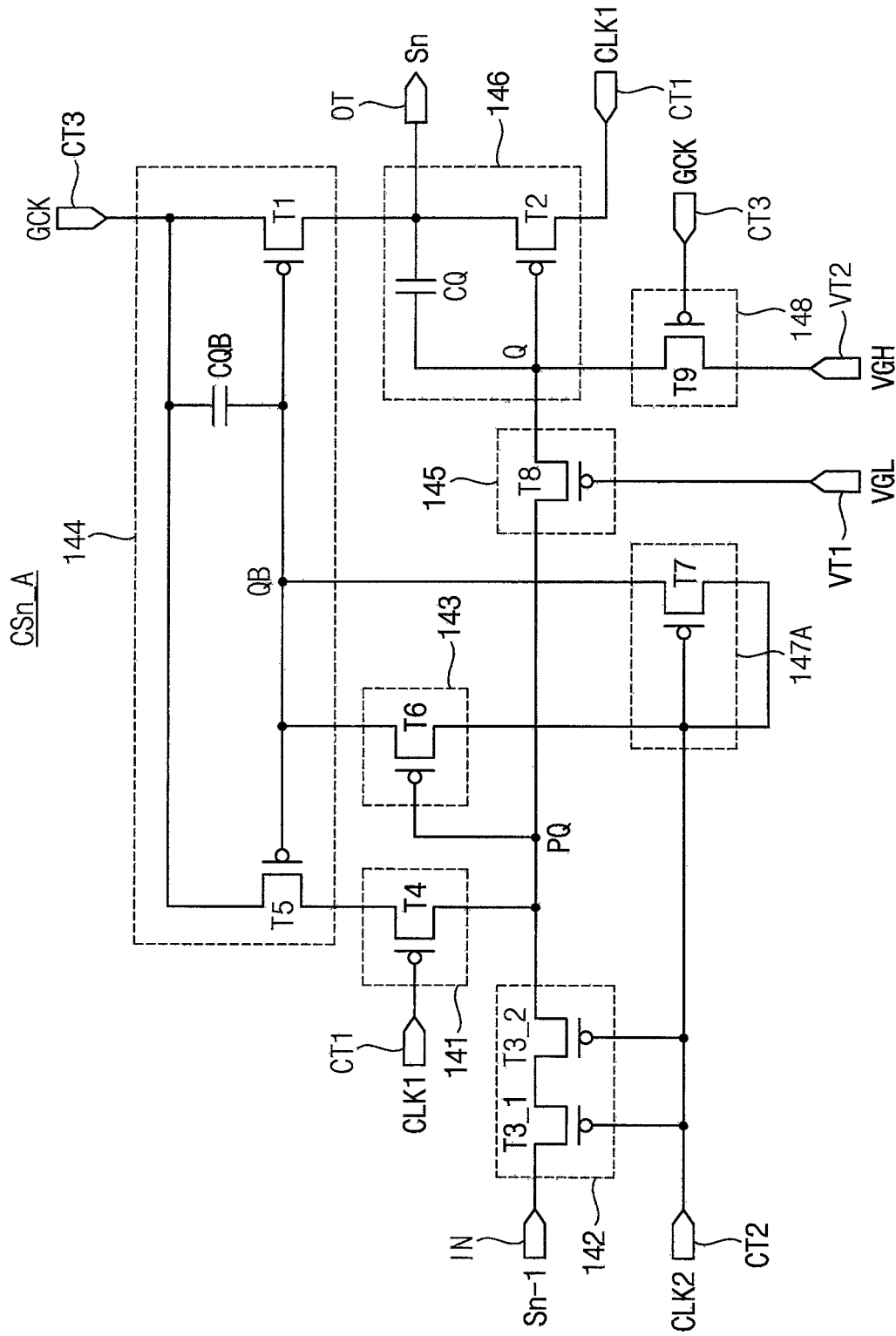
FIG. 6 is a circuit diagram illustrating a circuit stage according to one embodiment.

FIG. 6 is a circuit diagram illustrating a circuit stage according to one embodiment.

Referring to FIG. 6, n-th circuit stage CSn_A may include a first input part 141, a second input part 142, a first output controlling part 143, a first output part 144, a second output controlling part 145, a second output part 146, a holding part 147A, and a simultaneous driving part 148.

According to the embodiment, the holding part 147A includes a seventh transistor T7, which is diode-connected.

The seventh transistor T7 includes a control electrode and a second electrode, which are connected to the second clock terminal CT1, and a first electrode, which is connected to the QB node QB.

When the high voltage H of the second clock signal CLK2 is received from the second clock terminal CT2, the diode-connected seventh transistor T7 has a gate/source voltage Vgs of about 0 V. Thus, a reliability of the seventh transistor T7 may be improved.

Figure 7:
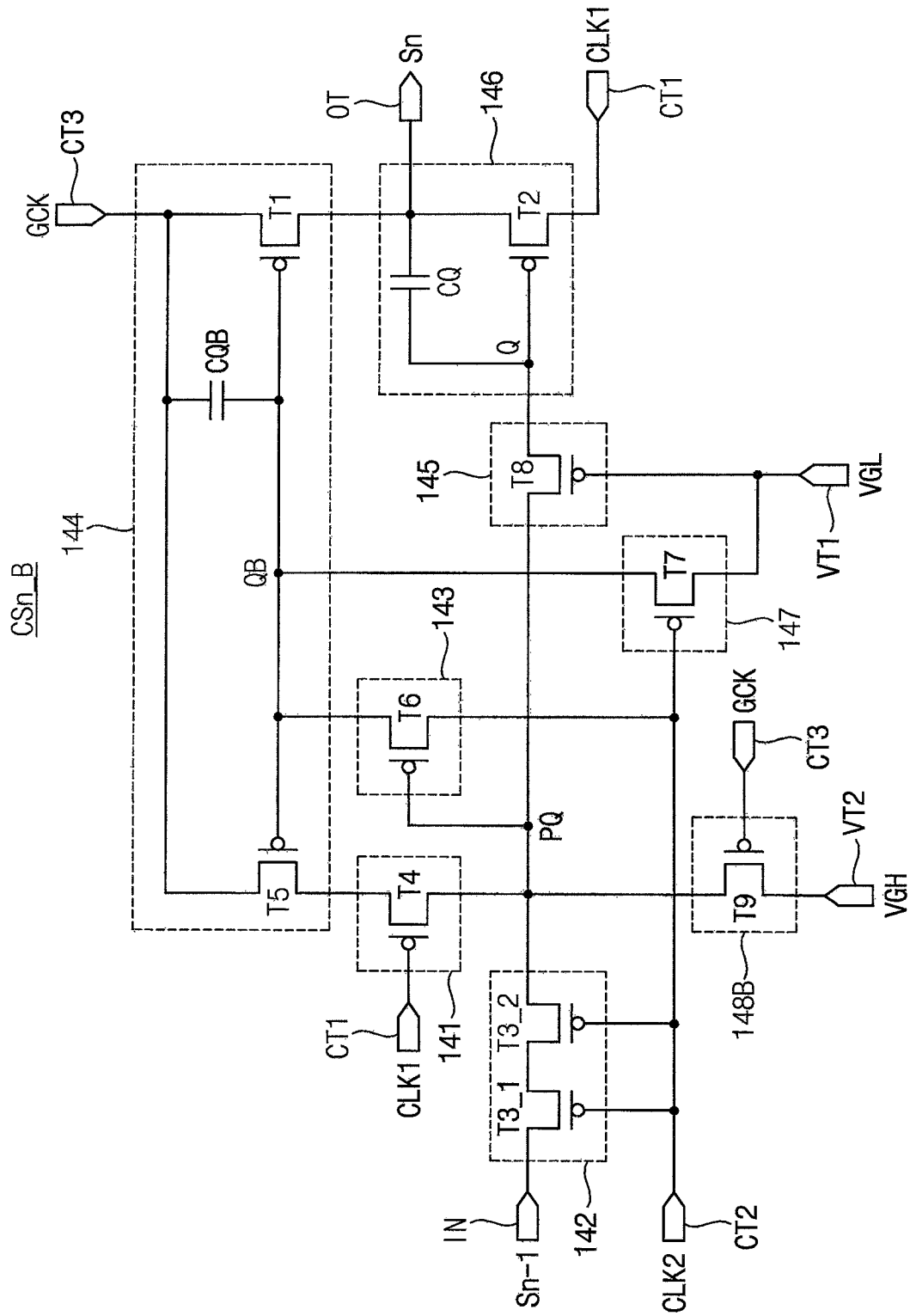
FIG. 7 is a circuit diagram illustrating a circuit stage according to one embodiment.

FIG. 7 is a circuit diagram illustrating a circuit stage according to one embodiment.

Referring to FIG. 7, the n-th circuit stage CSn_B may include a first input part 141, a second input part 142, a first output controlling part 143, a first output part 144, a second output controlling part 145, a second output part 146, a holding part 147, and a simultaneous driving part 148B.

According to the present embodiment, the simultaneous driving part 148B is connected to a PQ node PQ of the circuit stage. The simultaneous driving part 148B includes a ninth transistor T9. The ninth transistor T9 include a control electrode connected to the third clock terminal CT3, a first electrode connected to the PQ node PQ, and a second electrode connected to the second driving voltage terminal VT2.

According to the previous embodiments, when a voltage applied to the Q node Q is changed to the bootstrapped voltage 2L by the second capacitor CQ in the n-th horizontal period Hn of the sequential driving period, the ninth transistor T9 of the simultaneous driving part 148 connected to the Q node Q has a large drain/source voltage Vds. Thus, stress of the ninth transistor T9 is increased by the drain/source voltage Vds.

However, according to the present embodiment, the simultaneous driving part 148B is connected to a PQ node PQ, which is located in front of the Q node Q, and thus the stress of the ninth transistor T9 may be decreased by the drain/source voltage Vds. Therefore, in comparison with the previous embodiments, a reliability of the ninth transistor T9 may be improved.

Figure 8:
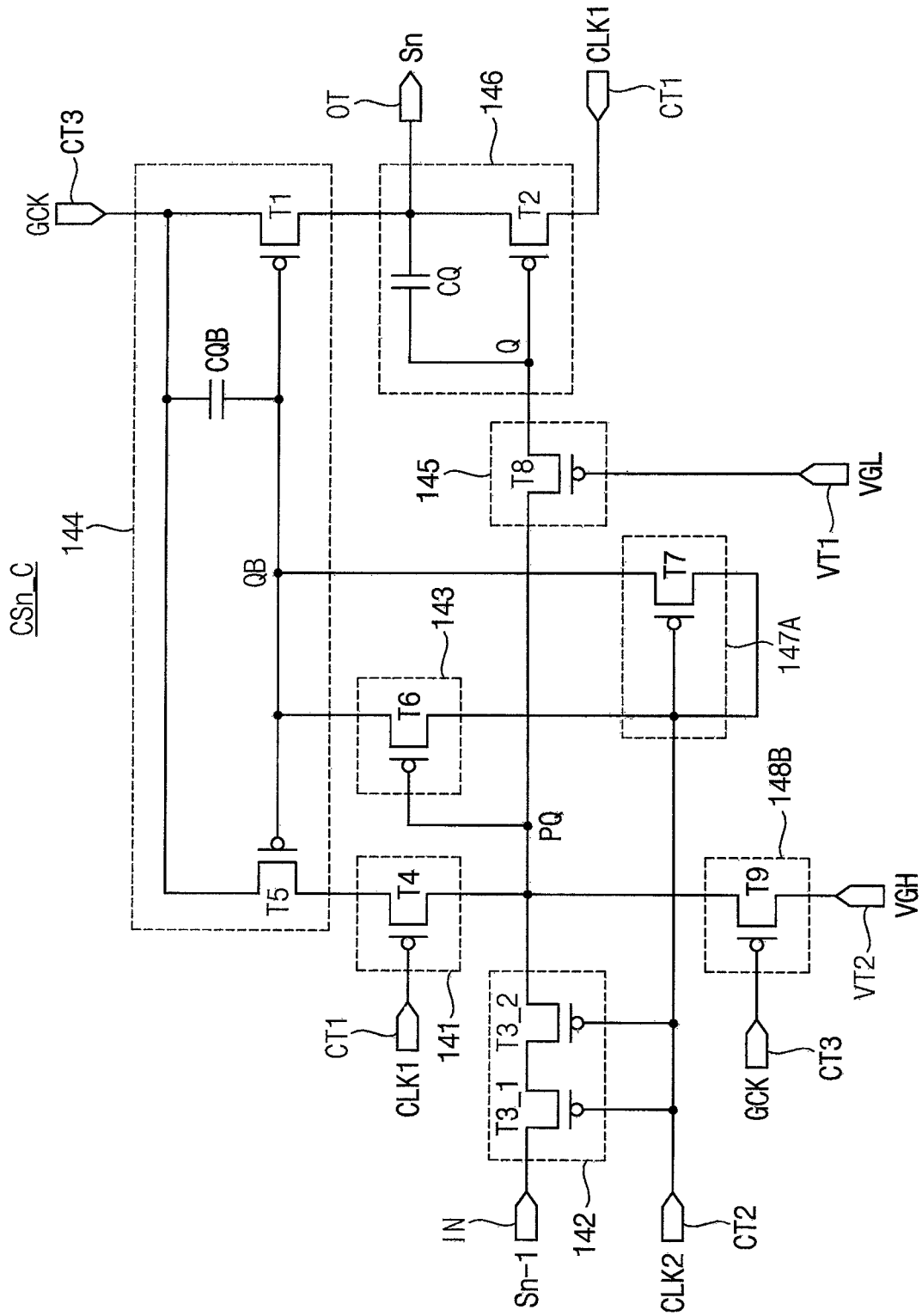
FIG. 8 is a circuit diagram illustrating a circuit stage according to one embodiment.

FIG. 8 is a circuit diagram illustrating a circuit stage according to one embodiment.

Referring to FIG. 8, the n-th circuit stage CSn_C may include a first input part 141, a second input part 142, a first output controlling part 143, a first output part 144, a second output controlling part 145, a second output part 146, a holding part 147A, and a simultaneous driving part 148B.

According to the present embodiment, the holding part 147A includes a seventh transistor T7 that is diode-connected. The simultaneous driving part 148B is connected to a PQ node PQ of the circuit stage.

According to the present embodiment, in the simultaneous driving period, when the QB node QB receives the bootstrapped voltage 2L, stress of the seventh transistor T7 by the gate/source voltage Vgs may be decreased. In addition, in the sequential driving period, when the Q node Q receives the bootstrapped voltage 2L, stress of the ninth transistor T9 by the drain/source voltage Vds may be decreased. Therefore, in comparison with the previous embodiments, a reliability of the n-th circuit stage CSn_C may be improved.

According to the embodiments described herein, the circuit stage of the scan driver includes the simultaneous driving part. Thus, the scan driver simultaneously outputs a plurality of scan signals to a plurality of scan lines during the simultaneous driving period, and sequentially outputs a plurality of scan signals to a plurality of scan lines during the sequential driving period.

The disclosed embodiments may be applied to a display device and an electronic device having the display device. For example, the disclosed embodiments may be applied to a computer monitor, a laptop, a digital camera, a cellular phone, a smart phone, a smart pad, a television, a personal digital assistant (PDA), a portable multimedia player (PMP), a MP3 player, a navigation system, a game console, a video phone, etc.

The foregoing is illustrative of the inventive concept and is not to be construed as limiting thereof. Although a few embodiments have been described, those skilled in the art will readily appreciate that many modifications are possible in the embodiments without materially departing from the novel teachings disclosed herein. Accordingly, all such modifications are intended to be included within the scope of the inventive concept as defined in the claims. In the claims, means-plus-function clauses are intended to cover the structures described herein as performing the recited function and not only structural equivalents but also equivalent structures. Therefore, it is to be understood that the foregoing is illustrative of the inventive concept and is not to be construed as limited to the specific embodiments disclosed, and that modifications to the disclosed embodiments, as well as other embodiments, are intended to be included within the scope of the appended claims. The inventive concept is defined by the following claims, with equivalents of the claims to be included therein.

What is claimed is:

1. A display device comprising:
a display panel comprising a switching transistor connected to a scan line and a data line, an emission control transistor indirectly coupled to the switching transistor, and an organic light emitting diode coupled to emission control transistor;
a timing controller configured to generate a first clock signal, a second clock signal that is different from the first clock signal, and a third clock signal that is different from the first and second clock signals;
a scan driver configured to generate a plurality of scan signals based on the first, second, and third clock signals, configured to simultaneously output the plurality of scan signals during a simultaneous driving period, and configured to sequentially output the plurality of scan signals during a sequential driving period, the scan driver comprising a plurality of circuit stages cascade-connected with each other, each circuit stage comprising:
a first input part configured to transfer a signal of a first node to first output part having a second node in response to a first clock signal;
a second input part configured to transfer a carry signal to the first node in response to a second clock signal that is different from the first clock signal;
a holding part configured to maintain a signal of the second node to a first driving voltage of a first level;
the first output part configured to transfer a third clock signal that is different from the first and second clock signals to an output terminal in response to the signal of the second node;
a second output part configured to transfer the first clock signal to the output terminal in response to a signal of a third node; and
a simultaneous driving part configured to turn off the second output part in response to the third clock signal.

2. The display device of claim 1, wherein the simultaneous driving part comprises a ninth transistor comprising a control electrode for receiving the third clock signal, a first electrode for receiving a second driving voltage, and a second electrode connected to the third node.

3. The display device of claim 1, wherein the simultaneous driving part comprises a ninth transistor comprising a control electrode for receiving a third clock signal, a first electrode for receiving a second driving voltage, and a second electrode connected to the first node.

4. The display device of claim 1, wherein the holding part comprises a seventh transistor comprising a control electrode for receiving the second clock signal, a first electrode for receiving the first driving voltage, and a second electrode connected to the second node.

5. The display device of claim 1, wherein the holding part comprises a seventh transistor comprising a control electrode and a first electrode for receiving the second clock signal, and a second electrode connected to the second node.

6. The display device of claim 1, wherein the third clock signal has a first level for a simultaneous driving period, and a second level for a sequential driving period, and
wherein the simultaneous driving part provides the third node with a second driving voltage of a second level in response to the third clock signal of the first level to turn off the second output part during the simultaneous driving period.

7. The display device of claim 6, wherein the circuit stage further comprises:
a first output controlling part configured to transfer the second clock signal to the second node in response to the signal of the first node; and
a second output controlling part configured to transfer the signal of the first node to the third node in response to the first driving voltage.

8. The display device of claim 6, wherein the first input part comprises a fourth transistor comprising a control electrode for receiving the first clock signal, a first electrode connected to the first node, and a second electrode connected to the first output part, and
wherein the second input part comprises a third transistor comprising a control electrode for receiving the second clock signal, a first electrode for receiving a carry signal, and a second electrode connected to the first node.

9. The display device of claim 8, wherein the first output part comprises a first transistor, a first capacitor, and a fifth transistor,
wherein the first transistor comprises a control electrode connected to the second node, a first electrode for receiving the third clock signal, and a second electrode connected to the output terminal,
wherein the first capacitor comprises a first electrode for receiving the third clock signal, and a second electrode connected to the second node, and wherein the fifth transistor comprises a control electrode connected to the second node, a first electrode for receiving the third clock signal, and a second electrode connected to the second electrode of the fourth transistor.

10. The display device of claim 9, wherein the second output part comprises a second transistor and a second capacitor,
wherein the second transistor comprises a control electrode connected to the third node, a first electrode for receiving the first clock signal, and a second electrode connected to the output terminal, and
wherein the second capacitor comprises a first electrode connected to the output terminal, and a second electrode connected to the third node.

11. A scan driver comprising a plurality of circuit stages cascade-connected with each other for outputting a plurality of scan signals, each circuit stage comprising:
a first input part configured to transfer a signal of a first node to a first output part having a second node in response to a first clock signal;
a second input part configured to transfer a carry signal to the first node in response to a second clock signal that is different from the first clock signal;
a holding part configured to maintain a signal of the second node as a first driving voltage of a first level;
the first output part configured to transfer a third clock signal that is different from the first and second clock signals to an output terminal in response to the signal of the second node;
a second output part configured to transfer the first clock signal to the output terminal in response to a signal of a third node; and
a simultaneous driving part configured to turn off the second output part in response to the third clock signal.

12. The scan driver of claim 11, wherein the simultaneous driving part comprises a ninth transistor comprising a control electrode for receiving the third clock signal, a first electrode for receiving a second driving voltage, and a second electrode connected to the third node.

13. The scan driver of claim 11, wherein the simultaneous driving part comprises a ninth transistor comprising a control electrode for receiving the third clock signal, a first electrode for receiving a second driving voltage, and a second electrode connected to the first node.

14. The scan driver of claim 11, wherein the holding part comprises a seventh transistor comprising a control electrode for receiving the second clock signal, a first electrode for receiving the first driving voltage, and a second electrode connected to the second node.

15. The scan driver of claim 11, wherein the holding part comprises a seventh transistor comprising a control electrode and a first electrode for receiving the second clock signal, and a second electrode connected to the second node.

16. The scan driver of claim 11, wherein the third clock signal has a first level for a simultaneous driving period, and a second level for a sequential driving period, and
wherein the simultaneous driving part provides the third node with a second driving voltage of a second level in response to the third clock signal having the first level to turn off the second output part during the simultaneous driving period.

17. The scan driver of claim 16, further comprising:
a first output controlling part configured to transfer the second clock signal to the second node in response to the signal of the first node; and
a second output controlling part configured to transfer the signal of the first node to the third node in response to the first driving voltage.

18. The scan driver of claim 16, wherein the first input part comprises a fourth transistor comprising a control electrode for receiving a first clock signal, a first electrode connected to the first node, and a second electrode connected to the first output part, and
wherein the second input part comprises a third transistor comprising a control electrode for receiving the second clock signal, a first electrode for receiving a carry signal, and a second electrode connected to the first node.

19. The scan driver of claim 18, wherein the first output part comprises a first transistor, a first capacitor, and a fifth transistor,
wherein the first transistor comprises a control electrode connected to the second node, a first electrode for receiving the third clock signal, and a second electrode connected to the output terminal,
wherein the first capacitor comprises a first electrode for receiving the third clock signal, and a second electrode connected to the second node, and
wherein the fifth transistor comprises a control electrode connected to the second node, a first electrode for receiving the third clock signal, and a second electrode connected to the second electrode of the fourth transistor.

20. The scan driver of claim 19, wherein the second output part comprises a second transistor and a second capacitor,
wherein the second transistor comprises a control electrode connected to the third node, a first electrode for receiving the first clock signal, and a second electrode connected to the output terminal, and
wherein the second capacitor comprises a first electrode connected to the output terminal, and a second electrode connected to the third node.

* * * * *